United States Patent [19]

Fleissner

[11] Patent Number: 4,460,867

[45] Date of Patent: Jul. 17, 1984

[54] METHOD AND CIRCUIT FOR MEASURING OF CURRENT

[75] Inventor: Horst Fleissner, Langenzenn, Fed. Rep. of Germany

[73] Assignee: Grundig E. M. V., Fürth, Fed. Rep. of Germany

[21] Appl. No.: 309,490

[22] Filed: Oct. 7, 1981

[30] Foreign Application Priority Data

Oct. 25, 1980 [DE] Fed. Rep. of Germany ....... 3040316

[51] Int. Cl.$^3$ ..................... G01R 19/00; G01R 17/06
[52] U.S. Cl. .............................. 324/117 H; 324/99 R; 324/102
[58] Field of Search ............ 324/117 H, 117 R, 99 D, 324/102, 99 R

[56] References Cited

U.S. PATENT DOCUMENTS

| 2,624,770 | 1/1953  | Yetter        | 324/102 |
| 3,159,787 | 12/1964 | Sexton et al. | 324/99 R |
| 3,323,057 | 5/1967  | Haley         | 324/117 |
| 3,573,616 | 4/1971  | Kahen         | 324/117 |
| 3,812,428 | 5/1974  | Trenkler      | 324/127 |

FOREIGN PATENT DOCUMENTS 2827601 6/1980 Fed. Rep. of Germany.
296139 9/1971 U.S.S.R.

Primary Examiner—Ernest F. Karlsen
Attorney, Agent, or Firm—Kane, Dalsimer, Kane, Sullivan & Kurucz

[57] ABSTRACT

A method and device for the contactless measuring of direct and alternating current, in particular current instantaneous values, by using a magnetic circuit having an air slot and a magnetic field dependent resistor through which a control current flows and a winding through which a measuring current flows. In order to provide a large measuring speed for picking up a rapid instantaneous value, for example, generated high current peaks, at least a further winding is mounted on the magnetic circuit, the voltage drops on the magnetic field dependent resistor are picked up and stored at the peak values or other typical values of the current to be measured. After completing the measuring current, the current in the equivalent current winding is increased and the already stored voltages corresponding to the measuring current are compared consecutively with the voltage drops on magnetic field depending resistor, corresponding to the increase in the amount in the equivalent current winding. At the same voltage values, the instantaneous current is determined by multiplying in the current in equivalent current winding by the winding number.

12 Claims, 3 Drawing Figures

METHOD AND CIRCUIT FOR MEASURING OF CURRENT

FIELD OF THE INVENTION

The present invention relates to an improved means of measuring current, AC, DC, and particularly instantaneous current, in a contactless manner.

BACKGROUND OF THE INVENTION

There presently exist methods for contactless measuring of direct currents whereby a closed magnetic circuit is provided which must be plugged into a measuring conductor and for this purpose, one must separate the current path.

Also, a method for contactless measuring of direct and alternate current is known which operates with field plates, wherein a compensation current is used which has the same frequency and phase as the current to be measured. See German Pat. No. DE-AS 27 19 073 issued June 22nd, 1978 to GRUNDIG E. M. V. A measuring device with a clip on probe manufactured by entitled GRUNDIG E. M. V. Model No. VW 1315 operates very well in accordance with the principle described therein and has a very good zero point stability and is therefore able to measure very small currents. Due to the compensation principle it is also suitable for larger currents.

In German Pat. No. DE-PS 28 27 601 issued June 12th, 1980 to GRUNDIG E. M. V. a method is described for the contactless measuring of direct and alternate currents by way of a magnetic core having an air slot and with a field plate therein through which a control current flows and at least one coil through which the measuring current flows with a further coil mounted on the magnetic core. The changing flow which occurs on this coil results in the actual change of the field plate voltage which are compared with nominal values and eventual deviations are compensated.

There exists a present need in the automobile field, particularly automobile measuring technology, to ascertain information regarding the compression in individual cylinders of an engine and how the ignition current operates. A problem with this is determining the individual generated peak valves of the ignition current which are usually on the order of approximately 100 A and above, and to make such a determination in a contactless manner, the compensation method aforenoted is too slow due to the required measuring speed, and accordingly direct measuring is necessary.

However, in usual direct measuring techniques the following considerations are necessary: direct measuring generally requires a linear transfer factor of one (for example, square) so as to be easily converted linearly; direct measuring requires that the absolute value the errors due to temperature air slot changes, foreign fields and magnetic saturation must be kept low or must be subsequently compensated or eliminated; and special apparatus is required so that commonly known parts such as a measuring transformer for a contactless current measuring i.e., magnetic circuit and field plate, are not generally utilized.

SUMMARY OF THE INVENTION

Accordingly, it is an object of the present invention to provide for a means capable of determining rapid instantaneous current values, i.e., current spikes or peaks, or other typical or desired values such as those utilized in ignition currents, in a contactless manner, avoiding the disadvantages aforenoted.

It is a further object of the present invention to provide for such current measurement through the use of standard components i.e., known measuring transformers such as that manufactured by GRUNDIG E. M. V. Model No. VW 1315A having the advantages aforenoted, in a substantially unchanged manner, allowing for all types of instantaneous currents to be measured, from direct current to the frequency limit of the transducer system.

These and other objects and advantages are realized by the present invention which provides for the contactless measuring of DC or AC, in particular current instantaneous values, by using a magnetic core or circuit with an air slot, with a magnetic field dependent resistor located therein through which a control current flows. A first winding is provided through which a measuring current (i.e., ignition current) flows, with this winding positioned so as to be capable of influencing the magnetic circuit. A second or equivalent current winding is provided and is positioned on the magnetic circuit. In such a situation, the voltage changes or drops at the magnetic field depending resistor due to changes in the measuring current are picked up and stored at the peak values or other typical values of the current measured as desired. Upon completion of the measuring current, the stored voltages are consecutively compared with the voltage change or drop on the magnetic field depending resistor while the current in the equivalent current winding is increased. At the same voltage values, the instantaneous current is measured by multiplying the equivalent current by the winding number providing the associated measuring or ignition current, for the particular peak or desired value.

An advantage of the invention is that known measuring transformers (for example, the aforementioned clip on proble of the device VW 1315A) can be used substantially unchanged. In addition, the control of the measuring operation of the peak values may be carried out automatically through commonly known means. Also the invention may be used in the relative measurement of the compression of combustion engines by way of the operation of the ignition current and automatic control of the measuring operation may be branched off and separate therefrom.

Note that the curve shape of the transducer characterizing line may have any given shape in wide limits (linearity is not required) with undesired influences on the transfer factor eliminated. This is since the current to be measured and the equivalent or matching current in the transformer having the same effect on the field plate voltage. The magnet core may be magnetized to the saturation point as long as the transfer characterizing line is sufficient for exactness and as long as the generated remanence is not too great or exceeds a desired permissible amount.

Also, since the current being measured is equal to the instantaneous or peak value of the ignition or measuring current, which is switched on and off, further unchanged flowing currents are eliminated in the measuring conductor. The low power requirement has been shown to be very advantageous, since the equivalent current to match the instantaneous or peak current flows only for a short time and may be low due to a large winding number and large inductivity due to speed does not have to be avoided.

In the specific application of the ignition current measuring, particular advantages exist in that the aforenoted device Model No. VW 1315A which uses a clip on probe or similar devices may be used as aforenoted. Accordingly, with only one clip on probe, a device may be provided which can measure direct current with a large measuring range and a very good zero point stability and in addition can measure instantaneous values. Also, when using a field plate, the clip on probe does not have to be poled in the ignition current measurement; it operates in both clamping directions equally.

BRIEF DESCRIPTION OF THE DRAWINGS

The above mentioned and other features and objects of this invention will become more apparent by reference to the following description which is to be taken in conjunction with the drawings wherein.

DETAILED DESCRIPTION OF THE PREFERRED EMBODIMENT

Figure 1:
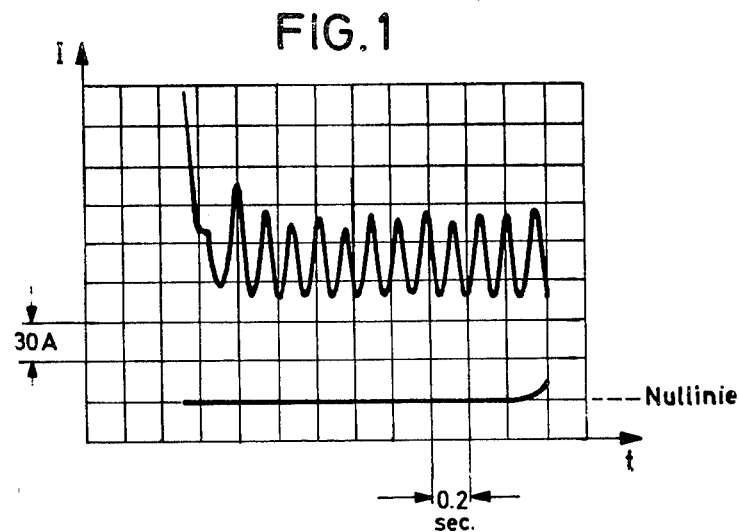
FIG. 1 is a graphical depiction of a typical ignition current curve.

Turning now to the drawings more specifically, FIG. 1 graphically depicts a typical ignition current curve, wherein on the abscissa the time is shown (1 scale mark corresponds to 0.2 sec) and on the ordinate the current is shown (1 scale mark corresponds to 30A). Note that while the present invention is particularly applicable in the measurement of ignition current and has been referred to as such herein, this is only by way of example and in no way should be considered exclusive.

Figure 2:
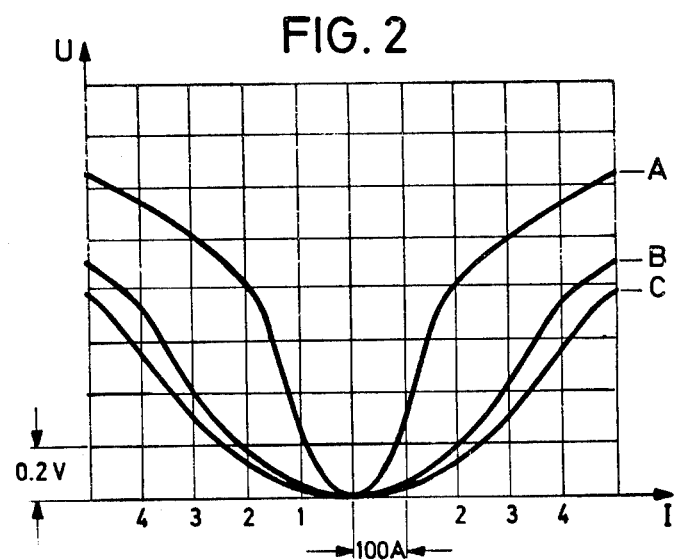
FIG. 2 is a graphical depiction of current voltage diagrams of the field plate of the measuring transformer at different parameters of the air slot.

Turning now to FIG. 2 this shows a current/voltage diagram on the field plate of a measuring transformer. In particular, the current/voltage diagram of the clip on probe of the device aforenoted, Model No. VW 1315A, is shown at different parameters (i.e., the voltage on the field plate at a particular direct field plate current (Ifp-direct) and at differing air slot specification) which depends upon flow of the current in a winding. On the abscissa 1 scale mark corresponds to 100 A, while on the ordinate 1 scale mark corresponds to 0.2 V.

Curve A of FIG. 2 represents that of a standard clip on probe and up to the bend at about 150 A, the flow is square and is flattened by the saturation range of the mumetal. The curve B in contrast of curve A constitutes the curve wherein an additional air slot of $2 \times 0.5$ mm is provided, while curve C corresponds to the clip on probe having added air slots of $2 \times 1$ mm and corresponds to a square shape above 400 A.

At such characterizing lines (curves A to C) the field plate voltage could be linearized by forming a root and it would only be usable with an additional air slot since the currents to be measured may be above 150 A. Note that absolute values can only be measured very inexactly due to the high temperature effect of the field plate and due to the total air slot which cannot be exactly maintained.

The use of the linear portion (not shown) of the field plate is not needed because an induction as a pre-magnetisation may be required which would be far into the saturation range of the most magnet types.

Turning now to the method involved in the present invention, a measuring transformer may be utilized such as the standard clip on probe as aforenoted, with a magnetic circuit made of mumetal. An air slot of about 0.7 mm is provided therein in which is disposed a magnetic field dependent resistor or plate, along with a compensation winding. The field plate can be fed through a pre-resistor with a direct voltage or a direct current to provide a control current therein.

The field plate voltages Ufp at the peak values of the current to be measured (ignition current) are stored. After completing measuring the current, a comparison operation is performed. The stored Ufp voltages are consecutively compared with the field plate voltage, while the current in a winding (preferably, the equivalent current winding is used) increases. When the voltages are equal, Ua=Ufp the instantaneous current in the equivalent current winding is multiplied by the winding number and is equal to the associated or matching measuring current. This is true as long as the measuring transformer has not changed between storing the voltages and the comparison, which has to be assumed due to the short time difference. All influences on the transfer factor are eliminated because the measuring current and the equivalent or matching current in the transformer have the same effect on the field plate voltage, whereby the curve shape of the transformer-characterization line may be held in given wide limits. Different increases mean only different sensitivities for the comparison.

If the increasing current to provide the matching current to that being measured is increasing staircase-like, a binary control signal can supply directly the input data for a microprocessor which can evaluate the measuring results in that it may perform a ratio conversion, for example. Currents which flow on the same line have no influence if they are unchanged during storing and subsequent comparison, and would not be contained in the measuring result.

The present method is suitable for the contactless measuring of any type of current instantaneous values from the direct current to the frequency limit of the transformer. A basic condition is that the measuring current and equivalent current do not flow simultaneously such as when the measuring current occurs in rapid succession. If the measuring current flows constantly and no other current flows in the measuring conductor, the clip on probe should be removed from the measuring conductor. Thereafter the equivalent current can flow to determine matching currents.

In addition to the field plate used as aforenoted, a Hall generator or other magnetic field dependent unit may be used. If a field plate is used, the current can only flow in one direction. However the Hall generator allows for the measuring and indication in both current directions. Further a Hall generator eliminates errors with the exception of the magnet remanence. But, the magnet remanence will interfer only if subsequent current of different polarity flows, and even this influence may be kept low by using a type of magnet with a small magnet remanence.

In conjunction with a field plate or a Hall generator, a massive magnet core, a laminated magnet core or a ferrit core may be used in the magnet circuit for higher limit frequency.

Further, for control of the equivalent current, a staircase or tumble generator may be provided in connection with the above mentioned parts (field plate, Hall generator or other magnetic field dependent units and different magnet core structure). Also, a differental amplifier may be used so as to sufficiently amplify the output voltage of the transformer and displace it in a range which is favorable for storing and comparison.

Figure 3:
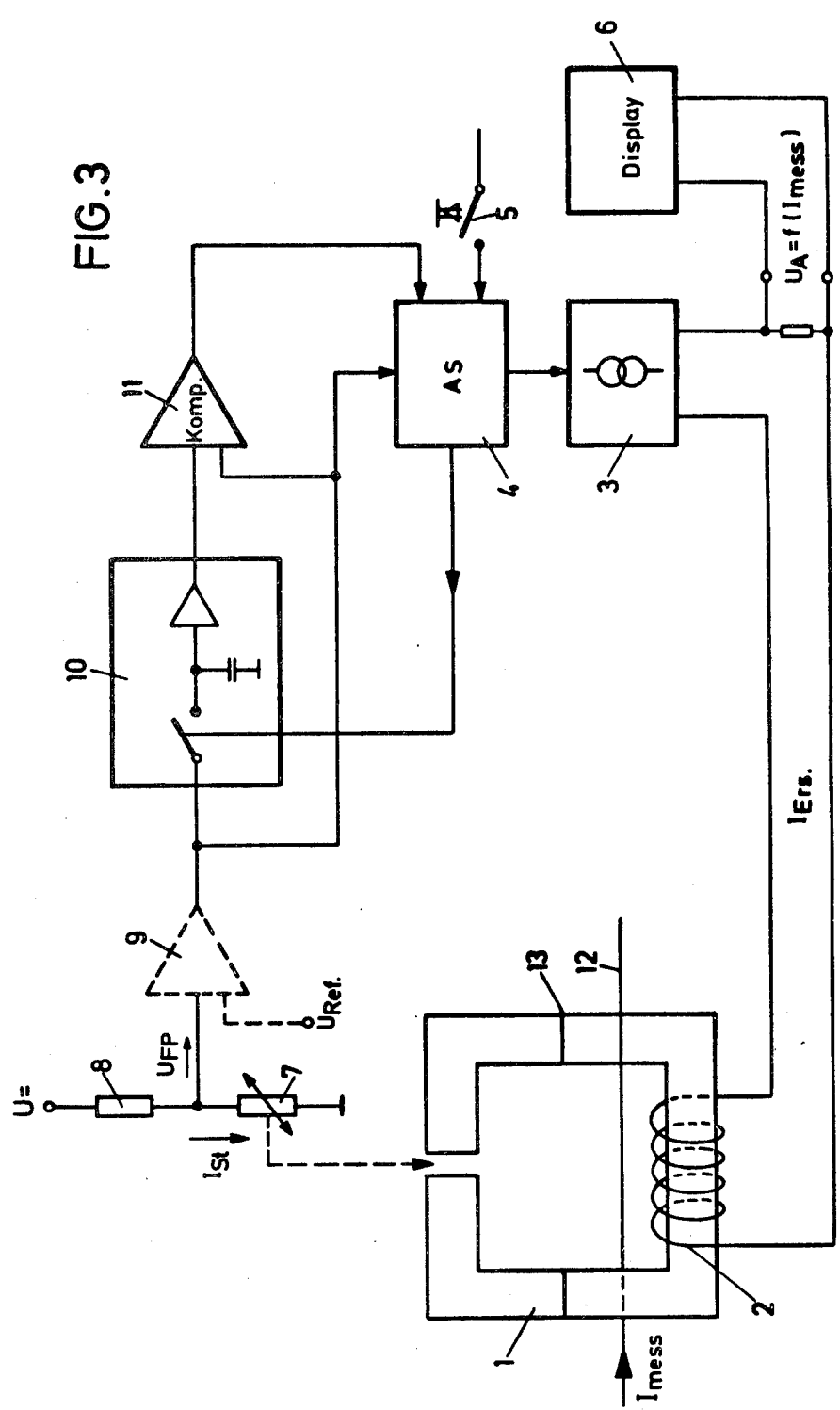
FIG. 3 is a somewhat schematic block diagram of the circuit embodying the present invention.

Turning now to FIG. 3, there is shown a somewhat block diagram schematic of the circuit capable of performing the aforenoted method and allows for the contactless measuring of direct and alternating currents or instantaneous or peak currents. In this regard a magnetic circuit 1 is provided which may include a magnetic core of the types aforenoted. The circuit 1 includes a winding 2 for the flow of an equivalent or matching current Iers., a power source 3 and separating joint 13. An operating control 4 is connected with the power source 3, and coupled to a scanning key 5 to provide for manual operation of the circuit rather than automatic, if so desired.

An indicator or display unit 6 having a storage is connected on the output clamps of the circuit 1 wherein the output voltage of the circuit UA is a function of the measured current Imess, (Ua=f (Imess).

A magnetic field dependent resistor or plate 7, which may be of the type aforenoted or any other element suitable for purpose, is provided in the air slot (0.7 mm) of the magnetic circuit 1 and grounded. A current is supplied through a resistor 8 which is coupled to a supply of direct current U. The voltage drop Ufp which occurs on the magnetic field dependent resistor 7 due to this current, is fed into an analog value storage 10 and to the input of a comparator 11, as well as to the input of the operating control 4. If need be, a preamplifier 9 may be placed between the magnetic field dependent resistor 7 and the analog value storage 10, with a reference voltage Uref fed to the preamplifier in addition to the already mentioned voltage drop.

A second output of the operating control 4 is coupled with a controllable switching element in the analog storage 10 which must be preset one time per measuring value. The output of the analog value storage 10 is coupled with the other input of the comparator 11 whose output inturn connects to an input of the operating control 4.

It might be noted that in accordance with FIG. 3, a conductor 12 (measuring conductor) is provided through which the current Imess runs "through" the magnetic circuit 1 which can be inserted after the opening of the magnetic circuit. Note that the analog units (analog value storage 10 and analog comparator 11) may be exchanged by a digital value storage; analog-digital-converter and a digital comparator in front thereof.

Also, instead of the analog value storage, a peak value storage may be used which is particularly suitable for measuring of alternate currents if at the same time a symmetric magnetic field dependent unit like the field plate is used. From the determined peak value, the effective value may be found and indicated for sine like current.

What is claimed is:

1. A method for measuring direct or alternate current, particularly instantaneous current values, in a contactless manner by using a magnetic circuit having an air slot in which is disposed a magnetic field dependent element and measuring winding comprising the following steps:
   providing an equivalent current winding on the magnetic circuit;
   sending a current flow on the measuring winding to generate a magnetic field in said magnetic circuit;
   storing the voltage induced across said magnetic field dependent element in response to said magnetic field;
   sending a current flow on the equivalent current winding upon completion of said storing;
   changing the amount of current in the equivalent current winding in a controlled fashion to cause a corresponding voltage change across the element; and
   comparing the voltage across the element to the stored voltage; and
   determining said current in said equivalent current winding when said voltage across said element equals said stored voltage.

2. Method in accordance with claim 1, which further includes the steps of providing a field plate as the magnetic field dependent element, and feeding said field plate with a constant or control current.

3. Method in accordance with claim 1 which further includes the step of providing a Hall generator as the magnetic field dependent element; and feeding said generator with a constant or control current.

4. Method in accordance with claim 1 which includes the steps of providing a massive laminated or ferrite magnet core as the magnetic circuit.

5. Method in accordance with claim 1 which includes the step of controlling the change of equivalent current in equivalent current winding by a tumbler generator control.

6. Method in accordance with any one of the preceeding claims 1 to 5, which includes the step of amplifying the output voltage of the magnetic field dependent element into a range which facilitates the storage and the comparison of the output voltage.

7. A circuit for measuring direct or alternating current in a contactless manner comprising:
   a magnetic circuit with an air gap;
   a magnetic field dependent element disposed within said air gap and adapted to generate a voltage in response to a magnetic field generated within said magnetic circuit;
   a measuring winding disposed on said magnetic circuit to generate a magnetic field in response to a first current;
   an equivalent current winding disposed on said magnetic circuit to generate a magnetic field in response to a second current;
   storage means for storing the voltage generated by said element in response to said first current;
   comparator means provided to compare the voltage stored by said storage means to the voltage generated by said element in response to said second current;
   power source means for supplying said second current and adapted to change said second current in a predetermined fashion; and
   means for measuring said second current;
   whereby said second current is equivalent to said first current when said comparator determines that said stored voltage and said voltage generated by said element in response to said second current are equal.

8. A circuit in accordance with claim 7, wherein said storage means provides for storage of analog values and said comparator means provides for the comparison of analog values.

9. A circuit in accordance with claim 8, wherein said storage means provides for storage of digital values and said comparator means provides for comparison of digital values; and means switching between analog and digital storage means and comparator means.

10. A circuit in accordance with claim 7 wherein said magnetic circuit includes a magnetic core which is passive, laminated or ferrite construction.

11. A circuit in accordance with one of the preceeding claims 7, and 8-10, wherein a preamplifier having two inputs is provided and is coupled between the element and the storage means whereby at the one input the voltage change on the element is placed and at the other input a reference voltage is placed.

12. A circuit in accordance with claim 7 wherein said storage means is capable of storing the voltage change on the element at the peak value of the measuring current.

* * * * *

UNITED STATES PATENT AND TRADEMARK OFFICE
CERTIFICATE OF CORRECTION

PATENT NO. : 4,460,867
DATED : July 17, 1984
INVENTOR(S) : Horst Fleissner

It is certified that error appears in the above—identified patent and that said Letters Patent is hereby corrected as shown below:

Column 7, lines 5-6: delete "passive"
insert --massive--

Signed and Sealed this

Twelfth Day of February 1985

[SEAL]

Attest:

DONALD J. QUIGG

*Attesting Officer*     *Acting Commissioner of Patents and Trademarks*